(12) United States Patent
Koizumi

(10) Patent No.: US 7,434,311 B2
(45) Date of Patent: Oct. 14, 2008

(54) PRINTED WIRING BOARD MANUFACTURING METHOD

(75) Inventor: Nobukazu Koizumi, Fujisawa (JP)

(73) Assignee: Maruwa Corporation, Fujisawa (JP)

( * ) Notice: Subject to any disclaimer, the term of this patent is extended or adjusted under 35 U.S.C. 154(b) by 196 days.

(21) Appl. No.: 11/320,013

(22) Filed: Dec. 27, 2005

(65) Prior Publication Data
US 2006/0257793 A1 Nov. 16, 2006

(30) Foreign Application Priority Data
May 12, 2005 (JP) .............................. 2005-139350
Oct. 4, 2005 (JP) .............................. 2005-291056

(51) Int. Cl.
*H01K 3/10* (2006.01)
(52) U.S. Cl. .............................. 29/852; 29/847; 216/18; 174/262
(58) Field of Classification Search .................. 29/830, 29/831, 846–849, 852, 853; 174/250, 255, 174/262; 205/125; 219/18, 19; 427/96.2, 427/97.7; 428/208, 901; 216/18, 19
See application file for complete search history.

(56) References Cited
U.S. PATENT DOCUMENTS
4,486,466 A * 12/1984 Leech et al. ................ 427/96.2
6,120,670 A * 9/2000 Nakajima .................... 205/125
6,210,537 B1 * 4/2001 Murphy et al. .............. 427/508
6,242,078 B1 * 6/2001 Pommer et al. ............. 174/255

FOREIGN PATENT DOCUMENTS
JP 11-195849 7/1999
JP 2004-291202 10/2004

* cited by examiner

Primary Examiner—Donghai D. Nguyen
(74) Attorney, Agent, or Firm—Jordan and Hamburg LLP

(57) ABSTRACT

This printed wiring board manufacturing method comprises the steps of providing a large number of through holes (for a through-hole) in a substrate made of an insulating material of which both sides are coated with a copper foil; making the inside of the through holes electrically conductive, coating the substrate with a photosensitive dry film, and developing and hardening the photosensitive dry film as a plating resist; and copper-plating the inside of the through holes and the opening periphery thereof. The manufacturing method further comprises the steps of coating the copper-plated area with a metal protective film, eliminating the photosensitive dry film; forming a circuit pattern; and conducting an overlaying treatment as a post-processing step.

5 Claims, 8 Drawing Sheets

FIG. 7A
FIG. 7E RELATED ART
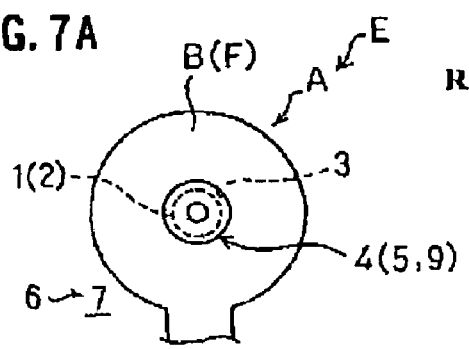
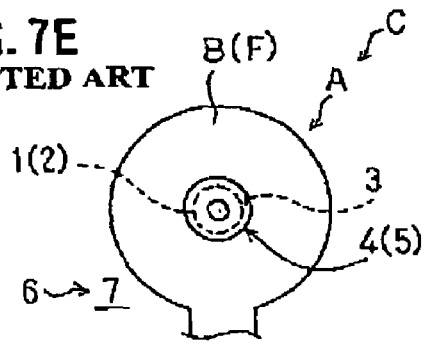
FIG. 7B
FIG. 7F RELATED ART
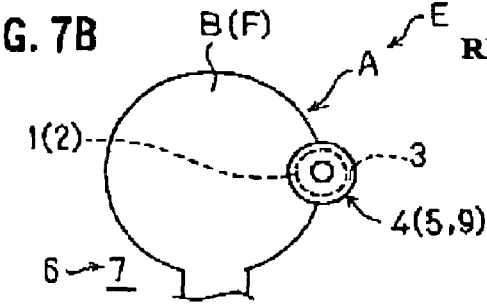
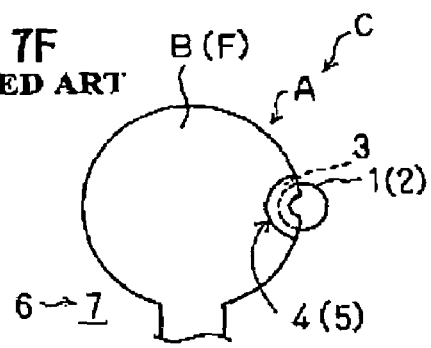
FIG. 7C
FIG. 7G RELATED ART
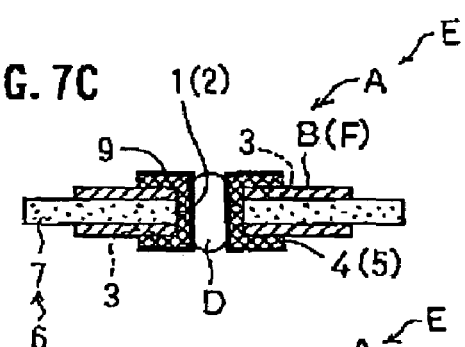
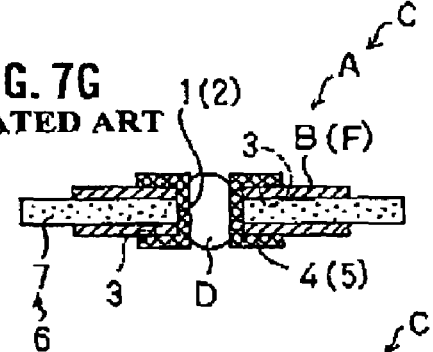
FIG. 7D
FIG. 7H RELATED ART
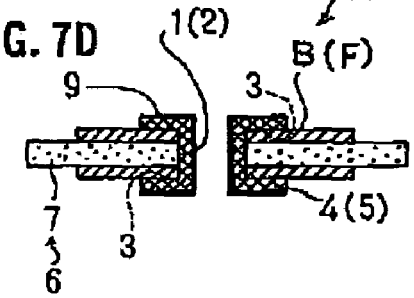
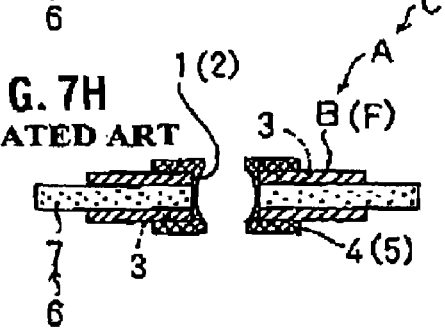

PRINTED WIRING BOARD MANUFACTURING METHOD

BACKGROUND OF THE INVENTION

1. Technical Field

The present invention relates to a printed wiring board manufacturing method, and in particular to a printed wiring board manufacturing method whereby a circuit pattern is formed on the outer surface of an insulating material.

2. Background of the Art

<<Technological Background>>

A printed wiring board, for example, a flexible printed wiring board has made remarkable progress in precision, thickness, and weight. In particular, high density and miniaturization of a formed circuit pattern is outstanding.

The printed wiring board is formed with a large number of minute through holes for electrically conducting a circuit pattern on both sides and for mounting semiconductor parts.

Two major methods, namely panel plating and button plating for such through-hole fabrication and electrical conduction, are used during the process for manufacturing the printed wiring board.

<<Panel Plating Method>>

Referring to a panel plating method, a copper foil is attached to both sides (i.e., front side and rear side) of an insulating material to form a substrate. After a number of through holes is made in the substrate, the insides of the through holes are made electrically conductive before copper electroplating the entire substrate.

According to the panel plating method, a circuit pattern is formed on the substrate, of which the inside of the through holes is made electrically conductive by copper-plating, by going through known patterning steps of exposing, developing, etching, and separating in that order. In this manner, a printed wiring board is manufactured.

However, according to such a panel plating method, not only the inside of the through holes, but also the copper foils on both sides are copper-plated, and as a result, the circuit patterns on both sides of the manufactured printed wiring board are also copper-plated. Thus, a drawback whereby not only flexibility and bendability deteriorate, but also weight increases has been pointed out and this has been regarded as a notable problem in the flexible printed wiring board.

<<New and Old Button Plating Methods>>

A button plating method has been developed as a method for overcoming such a drawback and is taking root in a field where more emphasis is put on lightness in weight as well as flexibility and bendability.

This button plating method comprises the steps of providing a number of through holes in a substrate; making the inside of the through holes electrically conductive; coating the substrate with a photosensitive dry film; applying a photomask, which is a negative mask, on the outside of the photosensitive dry film, and exposing and developing the photosensitive dry film as a plating resist; and copper-electroplating the inside of the opened through holes and the opening periphery of the through holes as a button section in a substantially button shape.

According to such a button plating method, the substrate of which the through holes and the like have been copper-plated is formed with a circuit pattern by following the patterning steps and thus, a printed wiring board is formed.

However, in this conventional button plating method (hereinafter referred to as "Old Button Plating Method"), it has been pointed out that the location of each through hole of the substrate and the location of each corresponding part of the photomask (and a specific electroplating location) are often out of position. In other words, according to this conventional button plating method, such an incorrect positioning or displacement is often caused by the expansion and contraction of the substrate and the photomask and the difficulty in a visual positioning operation between the substrate and the photomask and this displacement has resulted in a disconnection defect and the like.

In view of this problem, an inventor has improved the conventional button plating method and filed a patent application with a Japanese Patent Office under the serial number of 2004-291202 (hereinafter simply referred to as "New Button Plating Method").

According to this new button plating method, a developing solution in place of the photomask is poured into the through holes from the other side of the photosensitive dry film which is coated on one side of the substrate, the photosensitive dry film is then developed as a plating resist and is hardened by exposure, and copper-electroplating is conducted. As a result of adopting this new button plating method, the displacement problem pointed out in the old button plating method can be eliminated and occurrence of the disconnection defect resulting from the displacement can also be avoided.

<<Document Information on the Conventional Technology>>

An example of the old button plating method is disclosed in the following Patent Document 1.

Patent Document 1: Japanese Unexamined Patent Publication No. Hei 11-195849

DISCLOSURE OF THE INVENTION

<<Problems to be Resolved by the Invention>>

The following problems have been pointed out in such a printed wiring board manufacturing method according to the new and old button plating methods.

FIGS. 7E through 7H are provided to explain the conventional examples of this kind and show printed wiring boards manufactured in such a manner. FIG. 7E is an explanatory plan view showing an enlarged substantial part of one example and FIG. 7F is an explanatory plan view showing an enlarged substantial part of another example. FIG. 7G is an explanatory front cross-sectional view of an enlarged substantial part showing a soft etching solution in the puddle condition and FIG. 7H is an explanatory front cross-sectional view showing the enlarged substantial part after the passage of time.

<<First Problem>>

As described above, according to the old and new button plating methods, a number of through holes 2 (for through-holes 1) is provided in a substrate 6, wherein copper-plating 5 is applied to the inside of the through holes 2 and the opening periphery 3 of the through holes 2 as button sections 4. A circuit pattern A is formed on the substrate 6 by following patterning steps of exposure, development, etching and separation in that order.

In the case where the circuit pattern A is formed through such patterning steps, a number of formed button sections 4 and a number of lands B formed as part of the circuit pattern A are often out of position. In the case of large positional displacement, it is pointed out that the button section 4 drops out (is lost) and the manufactured printed wiring board C has a problem that a conduction defect easily occurs.

This problem will now be described in detail. As shown in FIG. 7E, it is ideal that a location (diameter) of each button section 4 which has been formed before patterning concentrically corresponds to a location (diameter) of each land B on the circuit pattern A side formed for connection to the button section 4 in patterning without any displacement (in such an ideal case, since the button section 4 and the land B are completely coated and protected with a photosensitive resist film of the land B for patterning, a problem of dissolution and elimination by an etching solution does not occur), but both the button section 4 and the land B are often out of position.

As shown in FIG. 7F, in the case where both the button section 4 and the land B are largely out of position, the button section 4 (i.e., a section protruding from the photosensitive resist film for the land B) is dissolved and eliminated by the etching solution and as a result, it drops out (partly). In this case, there is a risk of no conductive connection between the copper-plating 5 of the button section 4 and the land B on the circuit pattern A side and, as a result, the conductive defect often occurs.

It is considered that the occurrence of such displacement (incorrect positioning) results from expansion and contraction of the substrate 6 during exposition and development, expansion and contraction of the photosensitive resist film for forming the circuit pattern A, incorrect positioning and the like.

<<Second Problem>>

As a post-processing step to protect the formed circuit pattern A, an overlaying treatment such as attachment of a coverlay film and printing of a solder resist is conducted on the manufactured printed wiring board. Soft etching is conducted as a pre-processing step for this overlaying treatment for the purpose of eliminating an oxide film from the surface of a copper foil and roughening the surface.

After soft etching, as shown in FIG. 7G, a soft etching solution D left as a puddle within each through hole 2 often dissolves and eliminates each button section 4, in particular, the copper-plating 5 within the through hole 2 for a through-hole 1 as time goes by (see FIG. 7H). It is therefore pointed out that a disconnection defect of the printed wiring board C easily occurs due to the disconnection within such a through-hole 1.

It is to be noted that the puddling of the soft etching solution D within the through holes 2 responsible for such a disconnection defect is caused by insufficient cleaning or drying after soft etching.

SUMMARY OF THE INVENTION

<<Present Invention>>

A printed wiring board manufacturing method according to the present invention was created in view of such an actual situation to solve the problems found in the conventional technology stated above as a result of assiduous study efforts by the inventor.

It is therefore an object of the present invention to provide an improved printed wiring board manufacturing method which can, first, prevent a possible loss of a button section and a conductive defect in patterning and, second, prevent disconnection and a disconnection defect within a through-hole in an overlaying treatment.

<<Means for solving the Problems>>

Technical means for solving these problems are described hereunder.

According to the invention, a printed wiring board manufacturing method comprises the steps of providing a number of through holes in a substrate made of an insulating material coated with a copper foil; forming a conductive film for making the inside of the through holes electrically conductive; coating an outer surface of the substrate with a photosensitive dry film and developing and hardening the photosensitive dry film as a plating resist; and copper-plating the inside of the through holes, opened by causing the photosensitive dry film to be dissolved and eliminated, and copper-plating the opening periphery of the through holes.

The printed wiring board manufacturing method further comprises the steps of forming a metal protective film for coating the copper-plating with the metal protective film; separating and eliminating the photosensitive dry film; forming a circuit pattern with the copper foil; and conducting an overlaying treatment as a post-process for protecting the circuit pattern.

According to another aspect of the invention, the printed wiring board manufacturing method according to the invention is provided, in which, in the coating, developing and hardening steps, the photosensitive dry film is coated on one side of the outer surface of the substrate made of the laminated sheet of which both sides are coated with copper, and in the copper-plating step, at least the inside of the through holes and the opening periphery of the through holes on one side are copper-electroplated.

Further, a masking step for coating the other side of the outer surface of the substrate with a masking layer is conducted between the copper-plating step and the metal protective film forming step. A step for eliminating the masking layer is conducted together with the separating step after the metal protective film forming step.

According to another aspect of the invention, the printed wiring board manufacturing method according to the invention is provided, in which the coating, developing and hardening steps are conducted in that order on both sides of the outer surface of the substrate made of a laminated sheet of which both sides are coated with copper. In the copper-plating step, the inside of the through holes and the opening periphery of the through holes on both sides are copper-electroplated.

According to yet another aspect of the invention, the printed wiring board manufacturing method according to the invention is provided, in which the insulating material of the substrate is formed in a film shape with flexibility and the printed wiring board is a flexible printed wiring board.

According to a further aspect of the invention, the printed wiring board manufacturing method according to the invention The printed wiring board manufacturing method as first described hereinabove is provided, in which the insulating material of the substrate is made of a hard material and the printed wiring board is a rigid printed wiring board.

According to a yet further aspect of the invention, the printed wiring board manufacturing method according to the invention is provided, in which the metal protective film in the metal protective film forming step is formed with nickel gold plating, solder plating, tin plating, silver plating or nickel plating to protect the copper-plating against etching in the circuit forming step and against soft etching which is pre-processing for an overlaying treatment as the post-process.

According to a still further aspect of the invention, the printed wiring board manufacturing method according to the invention is provided, in which in the circuit forming step, the substrate is coated with the photosensitive dry film, the photosensitive dry film is then exposed, hardened and developed using a circuit mask, the copper foil of the substrate is etched, and the remaining photosensitive dry film is separated, thereby forming the circuit pattern.

According to yet a still further aspect of the invention, the printed wiring board manufacturing method according to the invention is provided, in which the overlaying treatment as a post-process is intended to form a protective film for the circuit pattern, and specifically, attachment or formation of a cover lay film and printing or formation of a solder resist after soft etching as pre-processing are selectively conducted or conducted simultaneously.

<<Operation and the Like>>

A manufacturing method of the present invention comprises the means described above. Operation and the like of the present invention will now be described hereunder.

(1) In this manufacturing method, after a large number of through holes is provided in a substrate, electrically conductive treatment is conducted on the inside of the through holes.

(2) A substrate is coated with a photosensitive dry film. After the photosensitive dry film is developed and hardened as plating resist, the inside of the through holes and the opening periphery are copper-electroplated.

Namely, the photosensitive dry film is coated on one side of the substrate to be developed and hardened, wherein at least the inside of the through holes and the opening periphery thereof on one side are copper-plated. In other words, the photosensitive dry film is coated on both sides of the substrate, to be developed and hardened, wherein the inside of the through holes and the opening periphery thereof on both sides are copper-plated.

The plating resist process of the photosensitive dry film is conducted by a method using a photomask or a method whereby a developing solution is poured into the through holes.

(3) The copper-plating within the through holes and the copper-plating on the opening periphery thereof are coated with a metal protective film. As described above, in the case where the inside of the through holes and the opening periphery thereof on one side have been copper-plated, the other side is coated with a masking layer in advance. The masking layer is eliminated after the metal protective film is formed. The photosensitive dry film is then eliminated.

(4) A circuit pattern is formed by copper foils on both sides of the substrate by following the patterning steps.

(5) An overlaying treatment as a post-processing step is conducted on the manufactured printed wiring board, that is, a flexible printed wiring board or a rigid printed wiring board.

(6) According to the present manufacturing method, first, even though the locations of a number of copper-plated areas, that is, the button sections, formed within the through holes and on the opening periphery sides and the locations of a number of lands on the circuit pattern sides formed in the patterning steps are out of position, the copper-plated areas of the button sections are coated and protected in advance with the metal protective film with etching resistance.

In this manner, the copper-plating of the button section (i.e., the protruding area not coated and protected with the photosensitive resist film for forming the land) is not dissolved and eliminated by the etching solution for patterning, but is kept as is.

Second, according to the manufacturing method of the present invention, the copper-plating of the button section is coated and protected with a metal protective film with etching resistance. Accordingly, the copper-plating of the button section is not dissolved and eliminated by a soft etching solution used for soft etching as a pre-processing step for the overlaying treatment even though the solution remains within the through holes as is.

(7) The printed wiring board manufacturing method according to the present invention has the following effects.

EFFECTS OF THE INVENTION

<<First Effect>>

A loss of the button section and a conductive defect therein can be avoided. Namely, in the manufacturing method according to the present invention, each button section is protected by the metal protective film with etching resistance. Accordingly, even though the location of the button section and the location of the land on the circuit pattern side for conductive connection to the button section are out of position in the subsequent patterning, each button section is not lost by etching, but is kept as is, unlike the conventional technology of this kind as described above.

Thus, even though slight displacement is caused between the button section and the land, the conductance between them can be secured as far as there is overlapping therebetween even a little. In this manner, the printed wiring board manufactured according to the present invention improves the conductive reliability in that an occurrence of the conductive defect as seen in the conventional technology of this kind can be avoided.

<<Second Effect>>

Disconnection and disconnection defects within the through-holes can be avoided in the overlaying treatment. Namely, in the manufacturing method according to the present invention, each button section is protected by the metal protective film with etching resistance. Even though, after soft etching is conducted in the subsequent overlaying treatment, the soft etching solution remains in the puddled condition, the copper-plating in each button section is not lost, but kept as is, unlike the conventional technology of this kind as described above.

In this manner, the printed wiring board manufactured according to the present invention improves the conductive reliability, in that disconnection within the through-holes as seen in the conventional technology of this kind can be avoided to prevent occurrence of the disconnection defect.

As is obvious from the above, the present invention has remarkable and great effects in that all the existing problems found in the conventional technology of this kind can be solved.

BRIEF DESCRIPTION OF THE DRAWINGS

The above and other objects, features and advantages of the present invention will become more apparent from the following description when taken in conjunction with the accompanying drawings.

FIG. 1 is an explanatory front cross-sectional view of an enlarged substantial part of a first example provided to explain the best mode for implementing a printed wiring board manufacturing method according to the present invention, wherein

FIG. 2 is an explanatory front cross-sectional view showing an enlarged substantial part of the first example provided to explain the best mode for implementing the present invention, wherein

FIG. 3 is provided to explain the best mode for implementing the present invention, in which FIGS. 3A through 3C are explanatory front cross-sectional views showing enlarged substantial parts of the first example, wherein FIG. 3A shows a metal protective film forming step, FIG. 3B shows a separating and eliminating step, and FIG. 3C shows a printed wiring board, while

FIG. 4 is an explanatory front cross-sectional view showing an enlarged substantial part of a third example provided to explain the best mode for implementing the present invention, wherein

FIG. 5 is an explanatory front cross-sectional view showing an enlarged substantial part of the third example provided to explain the best mode for implementing the present invention, wherein

FIG. 6 is an explanatory front cross-sectional view showing an enlarged substantial part of a fourth example provided to explain the best mode for implementing the present invention, wherein

FIGS. 7A through 7D are provided to explain the best modes for implementing the present invention and show printed wiring boards, wherein FIG. 7A is an explanatory plan view showing an enlarged substantial part of one example, FIG. 7B is an explanatory plan view showing an enlarged substantial part of another example, FIG. 7C is an explanatory front cross-sectional view of an enlarged substantial part showing a soft etching solution in the puddle condition and FIG. 7D is an explanatory front cross-sectional view showing an enlarged substantial part after the passage of time, while FIGS. 7E through 7H are provided to explain the conventional examples of this kind and show printed wiring boards, wherein FIG. 7E is an explanatory plan view showing an enlarged substantial part of one example, FIG. 7F is an explanatory plan view showing an enlarged substantial part of the other example, FIG. 7G is an explanatory front cross-sectional view showing an enlarged substantial part showing a soft etching solution in the puddle condition and FIG. 7H is an explanatory front cross-sectional view of the enlarged substantial part after the passage of time.

DETAILED DESCRIPTION OF THE PREFERRED EMBODIMENTS

<<Printed Wiring Board E>>

A printed wiring board E will be explained with reference to FIG. 8. The printed wiring board E is broadly classified into a flexible printed wiring board and a rigid printed wiring board. Each board is provided in such a manner that a circuit pattern A is formed as a conducting layer on one side or both sides of an outer surface of an insulating material 7.

The flexible printed wiring board is made of an insulating material 7, such as a polyimide film, of which the base material is flexible. In many cases, the circuit pattern A is formed on both sides (i.e., both front and rear side, in other words, both one side and the other side) of the insulating material 7.

On the other hand, the rigid printed wiring board is made of an insulating material 7, serving as a base material, such as a glass epoxy resin, a glass cloth and a ceramic, wherein the circuit pattern A is formed on one side (one of the front and rear sides) of the insulating material 7 or on both sides thereof (both front and rear sides, in other words, both one side and the other side).

The thickness of the insulating material 7 is, for example, between 20 μm and 60 μm, but the insulating material 7 of about 12 μm is also available. The thickness of a copper foil F forming the circuit pattern A is, for example, between 4 μm and 35 μm. The space between the circuit patterns A is now between 10 μm and 30 μm and the circuit pattern A has a tendency to be miniaturized.

In this specification, the printed wiring board E is described hereunder taking the flexible printed wiring board as an example. This printed wiring board E is formed in a film shape provided with flexibility and bendability as a whole and can be folded or bent three-dimensionally in use. Further, the progress of the printed wiring board E in high precision, high function, miniaturization, extreme thinness, lightness in weight and the like is remarkable as in the rigid printed wiring board, and high density and miniaturization of the formed circuit pattern A is outstanding.

Figure 8:
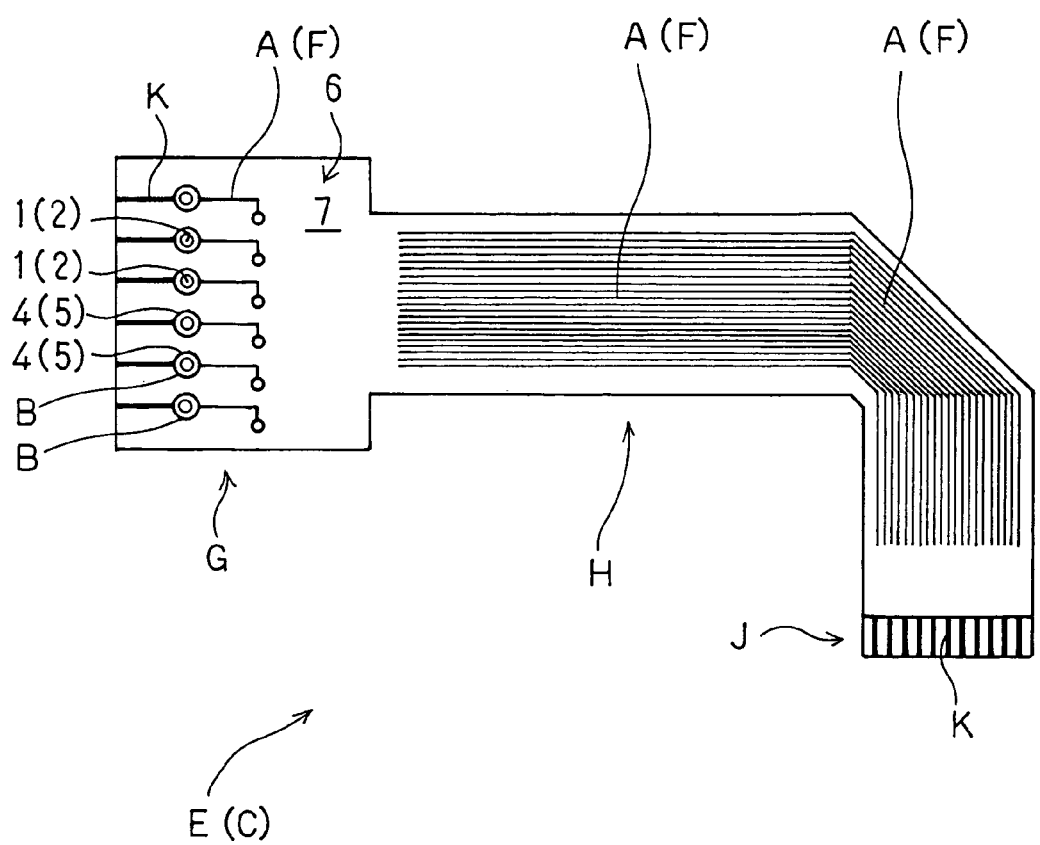
FIG. 8 is a schematic plan view of a printed wiring board patterned to explain the best mode for implementing the present invention.

FIG. 8 shows an example of such a printed wiring board E. This can be divided into a wiring end G, a bendable wiring section H and a wiring end J in terms of a structural area. The bendable wiring section H in the center can be folded or bent in use, and each end of the wiring ends G and J is provided with a terminal K. The bendable wiring section H is generally formed with a circuit pattern A only on one of the two sides. The wiring end G is formed with the circuit pattern A on both sides and is provided with a number of through-holes 1 and lands B.

The land B serves as part of the circuit patterns A. A number of lands is provided at the end or middle of the circuit pattern A, is formed in a circular or other shape and is, for example, concentrically connected to a button section 4 for connection on the through-hole 1 side. The printed wiring board E as shown in FIG. 8 is used, for example, as an optical pickup for read/write operations in a CD player and a DVD player.

The printed wiring board E is as outlined above.

<<Outline of Manufacturing Method>>

A manufacturing method of the printed wiring board E according to the present invention will now be described. This manufacturing method comprises the steps of providing a large number of through holes 2 (for through-holes 1) in a substrate 6 made of an insulating material 7 coated with a copper foil F; making the inside of each through hole 2 electrically conductive; coating an outer surface of the substrate 6 with a photosensitive dry film 8; developing and hardening the photosensitive dry film 8 as a plating resist; providing copper-plating 5 on at least the inside of the opened through holes 2 and the opening periphery 3 of the through holes 2; coating the copper-plating 5 with a metal protective film 9; eliminating the photosensitive dry film 8; forming a circuit pattern A with the copper foil F; and conducting an overlaying treatment as a post-processing step to protect the circuit pattern A.

Each step of the manufacturing method according to the present invention will now be described in the order of a first example of a new button plating method (one side), a second example of a new button plating method (both sides), a third example of an old button plating method (both sides) and a fourth example of an old button plating method (one side).

<<Example of Application to New Button Plating Method (One Side)>>

A manufacturing method according to a first example of the present invention, that is, an application example of the present invention to a new button plating method (one side), will be described with reference to FIGS. 1 and 2 and FIGS. 3A through 3C.

The manufacturing method according to this example comprises the steps of providing a number of through holes 2 (for through-holes 1) in a substrate 6 made of a laminated sheet of which both sides are coated with copper; making the inside of each through hole 2 electrically conductive; coating one side of an outer surface of the substrate 6 with a photosensitive dry film 8 with an outer masking layer 10 attached thereto; causing a developing solution L to enter the through holes 2 from the other side of the outer surface of the substrate 6; and developing the photosensitive dry film as a plating resist.

The manufacturing method further comprises the steps of exposing and hardening the photosensitive dry film 8; eliminating the outer masking layer 10; providing copper-electroplating 5 on the inside of the through holes 2, opened by causing the photosensitive dry film 8 to be dissolved and eliminated, on an opening periphery 3 of the through holes 2 on one side, and on the entire copper foil F on the other side; coating the copper-plating 5 and the like of the copper foil F of the substrate 6 on the other side with a masking layer 11; coating the exposed copper-plating 5 with a metal protective film 9 with etching resistance; eliminating the masking layer 11 and eliminating the photosensitive dry film 8; forming a circuit pattern A; and conducting an overlaying treatment as a post-processing step.

Figure 1A:
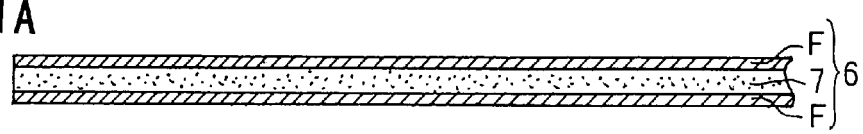
FIG. 1A shows a prepared substrate.

The manufacturing method according to such a first example will be further described hereunder. In this manufacturing method, the substrate 6 is first prepared as shown in FIG. 1A.

The substrate 6 (also referred to as a "film substrate" in the case of a flexible printed wiring board) consists of a laminated sheet (of which both sides are coated with copper) made of an insulating material 7 (also referred to as an "insulating film" in the case of the flexible printed wiring board) of which both sides are coated with a copper foil F. In the case of the flexible printed wiring board, the insulating material 7 serving as a base material is made of a polyimide resin film, an aramid resin film, a liquid crystal polymer film or other resin film provided with flexibility and insulation performance. A rolled foil, an electrolytic foil, a special electrolytic foil, a plating foil or the like is used as the copper foil F.

There are a double layer type and a single layer type in such an insulating material 7A. In the case of the double layer type, a copper foil F is laminated on both sides of the insulating material 7 through an adhesive agent. Used as an adhesive agent are an epoxy resin, a halogen-free epoxy resin, a high Tg epoxy resin and the like. On the contrary, in the single layer type, the copper foil F is directly attached to both sides of the insulating material 7 for lamination. The insulating material 7 of the single layer type is made using a casting method, a laminator method, a metalliding method (a sputtering method) or the like.

The laminated sheet of which both sides are coated with copper is broadly interpreted in this specification and includes various types of laminates. For example, a so-called laminated sheet of which one side is coated with copper also includes a type in which a copper foil F is laminated on the other side using an adhesive agent.

Figure 1B:
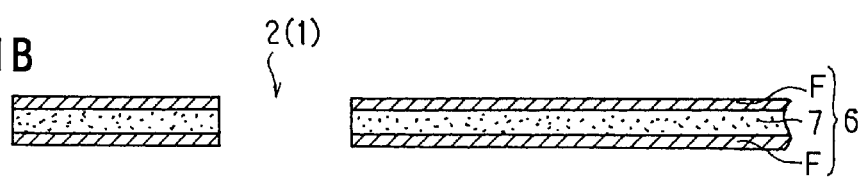
FIG. 1B shows a drilling step.

In this manufacturing method, as shown in FIG. 1B, a number of through holes 2 (for through-holes 1) is provided in the substrate 6 prepared in this way.

The through-hole 1 is a minute pore penetrating both sides (i.e., front side and rear side, in other words, one side and the other side) of the printed wiring board E. A number of through-holes 1 is provided in a sheet of printed wiring board E. The through-hole 1 is used for conductive connection between the circuit patterns A on both sides and/or for installing semiconductor parts and the like to be mounted on the circuit pattern A. The diameter of the through-hole 1 is often between 0.2 mm and 0.5 mm. In the case of the through-hole 1 made by a drilling method, the diameter is about 0.1 mm, while in the through-hole 1 drilled by a laser, a diameter of about 0.05 mm is also available at the present time.

A large number of through holes 2 to be used as such through-holes 1 is first provided in the substrate 6. A drill, laser or the like is used for making a hole and such operation is implemented by a NC machine tool in every sheet or in a roll.

Figure 1C:
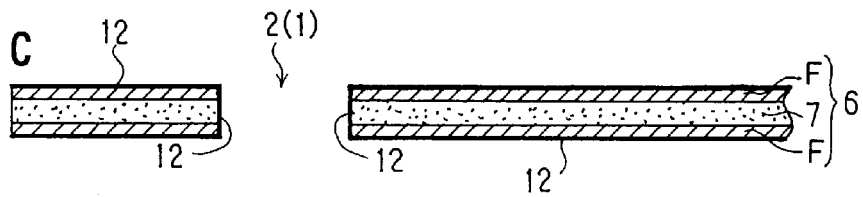
FIG. 1C shows a conductive film forming step.
Figure 1D:
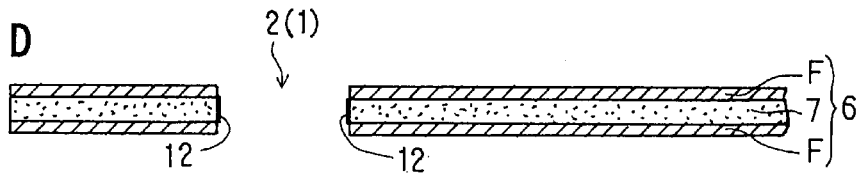
FIG. 1D shows a soft etching step.

In this manufacturing method, as shown in FIGS. 1C and 1D, a conductive film 12 is formed on the inner wall surface (hereinafter simply referred to as "within each through hole 2" or "the inside of each through hole 2") of each through hole 2 of the substrate 6 in which a number of through holes 2 were provided, by a direct plating method or an electroless copper-plating method.

Referring to the direct plating method as shown in the figure, as shown in FIG. 1C, a palladium treatment is continuously conducted on the entire substrate 6, in other words, on the outer surface of the copper foil F coated on both sides of the substrate 6 and the inner wall surface of the through holes 2, wherein a minute irregularity (i.e., concavity and convexity) of palladium is provided as a conductive film 12.

Then, as shown in FIG. 1D, soft etching is conducted to eliminate the conductive film 12 from the outer surface of the copper foil F. The conductive film 12 is provided only on the inner wall surface of the through holes 2, to be more accurate, only on the surface of the insulating material 7 exposed to the inner wall surface of the through holes 2, thereby adhering there to remain in that condition. In this manner, the conductive film 12 is formed on the inner surface of the through hole 2.

In the direct plating method, carbon, carbon graphite or other conductive material can also be used in place of the palladium. However, in the case where the conductive film 12 is formed by the electroless copper-plating method not by such a direct plating method, the electroless copper-plating is applied not only on the inner wall surface of the through holes 2, but also on the outer surface of the copper foil F on both sides.

Figure 1E:
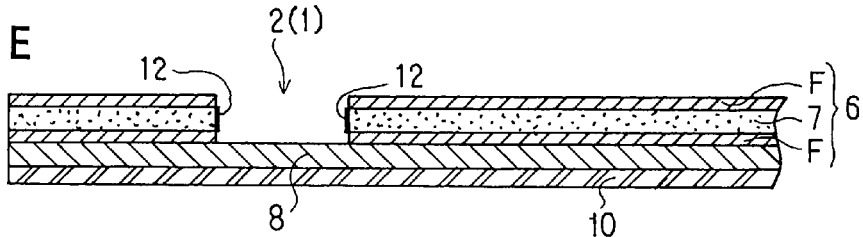
FIG. 1E shows a coating step and FIG. 1F shows a developing step.

In this manufacturing method, as shown in FIG. 1E, each through hole 2 of the substrate 6 is formed with the conductive film 12, and the whole area of one side (the rear side in the figure) of the outer surface of the substrate 6 is coated with a photosensitive dry film 8.

The photosensitive dry film 8 coated in this manner is further coated with the outer masking layer 10 attached to the photosensitive dry film 8 later or in advance. Used as the outer masking layer 10 is a separator for protecting the surface of the photosensitive dry film 8, a PET resin film with a low adherent adhesive agent or other transparent material with adhesion properties.

In this manner, one side of the substrate 6 is coated with the photosensitive dry film 8 with the outer masking layer 10 attached.

Figure 1F:
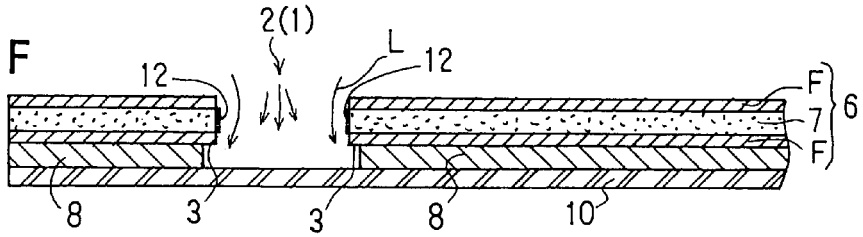

In this manufacturing method, as shown in FIG. 1F, the substrate 6 coated with the photosensitive dry film 8 and the like is developed. In other words, a developing solution L is caused to enter each through hole 2 from the other side of the substrate 6 so that the photosensitive dry film 8 on the opening periphery 3 of the through hole 2 on one side is dissolved and eliminated by the developing solution L, wherein the remaining photosensitive dry film 8 is developed as a plating resist.

Namely, the developing solution L is sprayed from the other side (front side) of the substrate 6, that is, from an open side which is a non-masking surface on which no coating is applied, or the substrate 6 itself is dipped entirely in a tank of the developing solution L. In this manner, the developing solution L infiltrates into the through hole 2 from the other side (i.e., front side) and goes through the through hole 2 to partially dissolve and eliminate the photosensitive dry film 8 on one side (i.e., rear side). In other words, the developing solution L dissolves and eliminates the opening space of the through hole 2 on one side and the opening periphery 3 thereof.

The dissolution and elimination of a predetermined section of the through hole 2 on one side can be implemented at a proper area by controlling the concentration, temperature, injection pressure, injection time (dipping time) and the like of the developing solution L of a sodium carbonate and the like.

The photosensitive dry film 8 is thus developed in a shape with a hole, necessary as the plating resist, by making use of a so-called liquid infiltration phenomenon and as a result, an opening with a diameter slightly larger than that of the through hole 2 is formed on one side of the through hole 2.

Figure 2A:
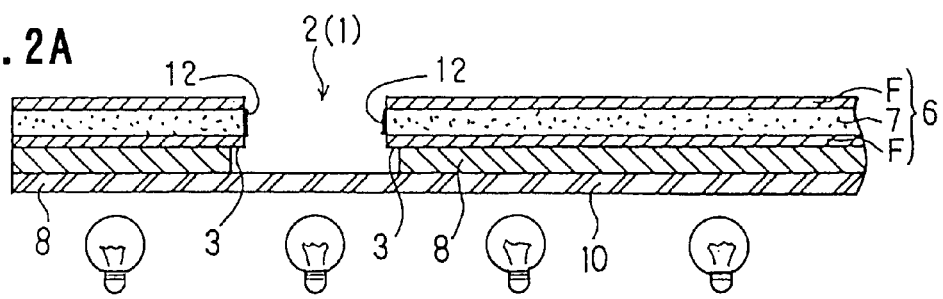
FIG. 2A shows an exposing step.

In this manufacturing method, as shown in FIG. 2A, the substrate 6 is provided in such a manner that the photosensitive dry film 8 developed in such a manner is first dried and then hardened by exposure. Namely, the photosensitive dry film 8 formed in a shape with a necessary hole as the plating resist is immediately exposed to light for UV exposure by an exposure machine and is hardened by the photo-polymerization.

Figure 2B:
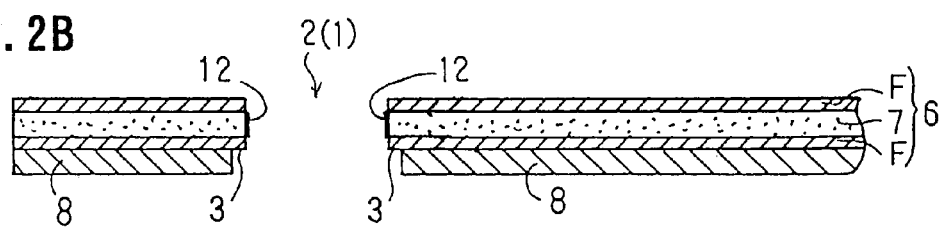
FIG. 2B shows a separating step.

Next, as shown in FIG. 2B, the outer masking layer 10 is separated from the substrate 6. In other words, in the substrate 6 on which the photosensitive dry film 8 has been developed, the outer masking layer 10 which has maintained a solid surface shape without a hole, unlike the photosensitive dry film 8 is separated and eliminated from the outer surface of the photosensitive dry film 8 which has become the plating resist.

Figure 2C:
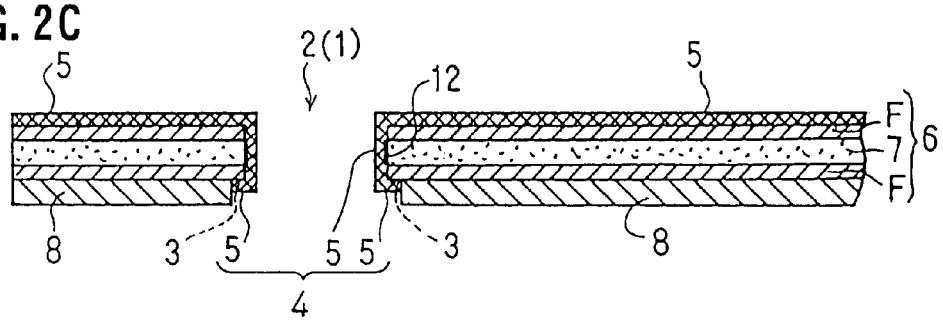
FIG. 2C shows a copper-plating step.

As shown in FIG. 2C, a copper-electroplating 5 is applied on the substrate 6 from which the outer masking layer 10 has been separated, wherein the copper is separated out from the entire copper foil 2 on the other side, from the conductive film 12 on the inner wall surface of each through hole 2, and from the opening periphery 3 of the through hole 2 on one side. In this manner, the copper-plating 5 is conducted on a section of the substrate 6 which has not been masked by the photosensitive dry film 8 developed and hardened as the plating resist.

In this manner, the copper is thoroughly and continuously separated out from the outer surface of the copper foil F on the other side (front side), from the conductive film 12 forming the inner wall surface of the through hole 2, and from the opening periphery 3 of the through hole 2 on one side (rear side) for copper-plating 5. The copper plating 5 formed on the opening periphery 3 of the through hole 2 on one side is formed in a flange shape, that is, in a collar shape, concentric with the through hole 2.

The copper plating 5 on the inner wall surface of the through hole 2 and the copper-plating on the opening periphery 3 on one side is collectively referred to as a button section 4.

Figure 2D:
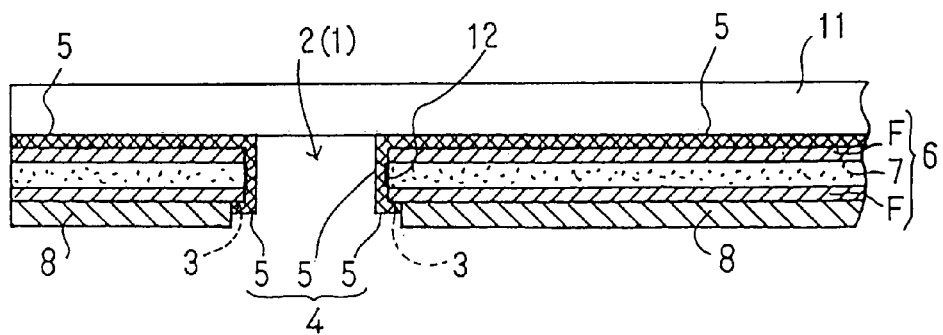
FIG. 2D shows a masking step.

Next, in this manufacturing method, as shown in FIG. 2D, the other side (front side in the figure) of the substrate 6 is coated with a masking layer 11. Used as the masking layer 11 is a PET resin film with slight adhesion or other coated material with adhesion. The masking layer 11 is laminate-coated on the copper-plating 5 of the copper foil F on the other side, opening space of each through hole 2 and the like.

Figure 3A:
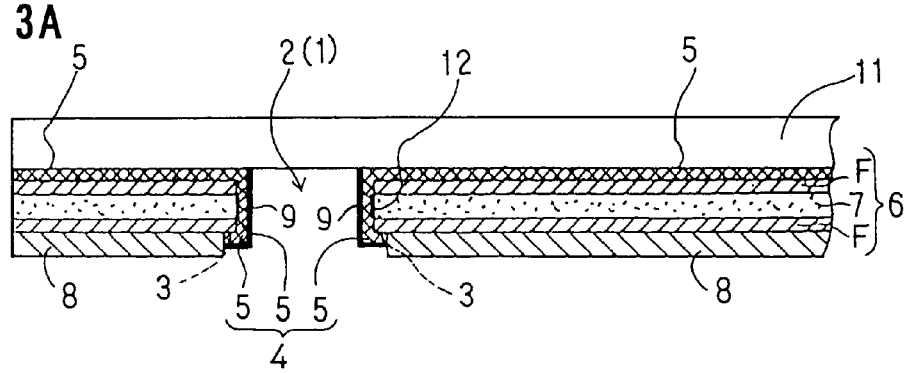

As shown in FIG. 3A, the copper-plating 5 exposed without being coated with the masking layer 11 is coated with a metal protective film 9 with etching resistance.

Namely, the button section 4 consisting of the copper-plating 5 on the inner wall surface of each through hole 2 and the copper-plating on the opening periphery 3 on one side (rear side) is coated with a metal protective film 9. Thus, the copper-plating 5 of the button section 4 is protected against an etching solution (cupric chloride, ferric chloride, an alkaline etching solution or other copper solution) in etching in a step of forming a circuit pattern A as post-processing and in soft etching as pre-processing for the overlaying treatment. This metal protective film 9 is selectively formed by any one of nickel gold plating, solder plating, tin plating, silver plating, nickel plating or the like according to an electroplating method or an electrolytic plating method.

Figure 3B:
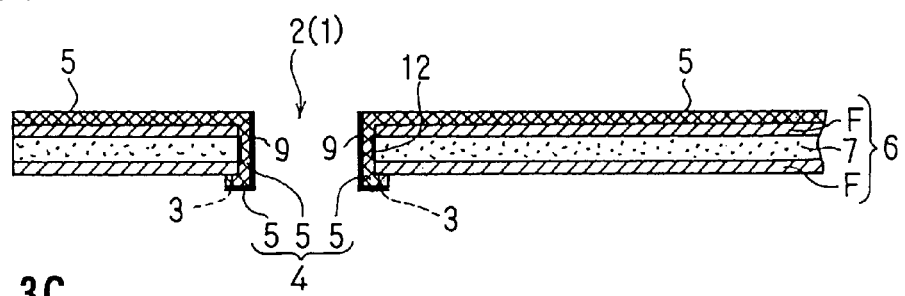

As shown in FIG. 3B, the masking layer 11 and the photosensitive dry film 8 are separated and eliminated from the substrate 6. Namely, by spraying a resist separating solution (a caustic soda or other separation solution), the masking layer 11 and the photosensitive dry film 8 used as the resist for the conductive film 12 and the copper-plating 5 are separated and eliminated.

Figure 3C:
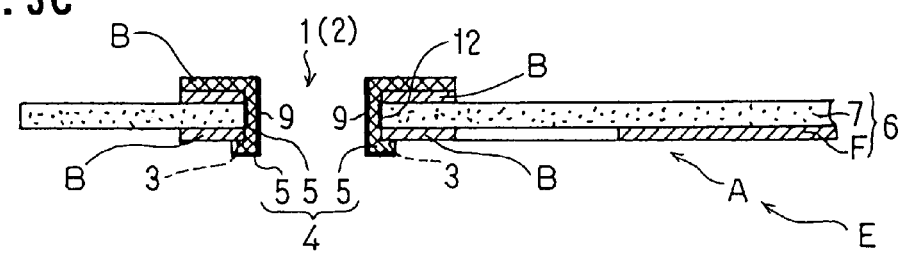

In this manufacturing method, as shown in FIG. 3C, a circuit pattern A is formed on both sides of the substrate 6 by following the known patterning steps after going through each step described above.

For example, the circuit pattern A is formed by the copper foil F on both sides of the substrate 6 by following the known steps of coating by attachment of the photosensitive resist film, exposure using the photomask which is a negative mask of the circuit pattern A, that is, exposure of the circuit pattern A, developing and drying for eliminating the photosensitive resist film of an unexposed section, etching of a section in which the photosensitive resist film has been opened, separation of the photosensitive resist film and the like. In this manner, the printed wiring board E as shown, for example, in FIGS. 3C and 8, is manufactured. Available as the photomask, that is, the negative mask which is a circuit mask, used to form such a circuit pattern A are a film type and a glass type (glass dry plate).

An overlaying treatment is conducted as a post-processing step. Namely, in the printed wiring board E manufactured in such a manner, soft etching of about 1 μm to 2 μm is thinly carried out on the surface of the copper foil F of the circuit pattern A as a pre-processing step for the overlaying treatment for the purpose of eliminating the oxide film and roughening the surface.

Then, the overlaying treatment is performed. Namely, a cover lay film is formed as a film for totally insulating and protecting the circuit pattern A using an attachment (CV attachment) method or a photographic method, while a solder resist is formed as a film for protecting the circuit pattern A against a solder in the case of mounting the semiconductor parts using a printing (S/R printing) method or a photographic method. Formation of the coverlay film and formation of the solder resist are implemented together or one of them is implemented.

The application example of the present invention to the new button plating method (one side) is as described above.

<Example of Application to the New Button Plating Method (Both Sides)>

The manufacturing method of a second example of the present invention, that is, an application example of the present invention to the new button plating method (both sides) will be described with reference to FIG. 3D.

Figure 3D:
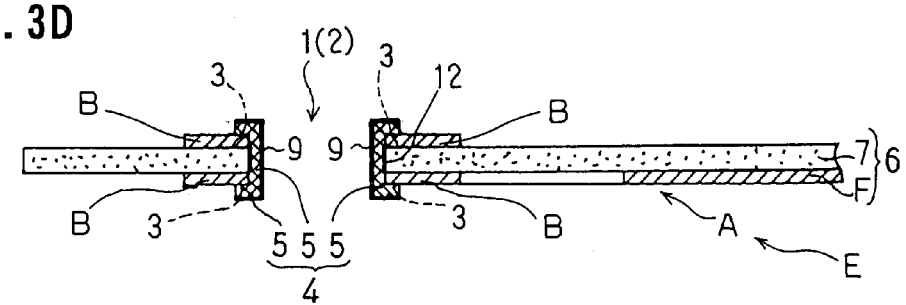
FIG. 3D is an explanatory front cross-sectional view showing an enlarged substantial part of a second example and shows a printed wiring board.

In the manufacturing method of this second example as shown in FIG. 3D, the inner wall surface of each through hole 2 of the substrate 6, the opening periphery 3 of the through hole 2 on one side, and the opening periphery 3 thereof on the other side are copper-electroplated as the button section 4 by partially repeating the intermediate step sections of the manufacturing method of the first example described above. Namely, the button section 4 is not only formed on the inside of the through hole 2 and the opening periphery 3 of the through hole 2 on one side, but also on the opening periphery 3 of the through hole 2 on the other side as seen in the manufacturing method of the first example described above.

The copper-plating 5 of the button section 4 is coated with a metal protective film 9 with etching resistance.

The manufacturing method of such a second example is described below in detail. In this manufacturing method, by following each step as shown in FIGS. 1A through FIG. 2B in the same manner as the first example, the photosensitive dry film 8 is coated, developed and hardened, as a plating resist, on one side of the substrate 6 in which a number of through holes 2 with the conductive film 12 attached is provided, and an outer masking layer 10 is then separated and eliminated.

Then, the photosensitive dry film 8 is also coated, developed and hardened, as the plating resist, on the other side of the substrate 6 unlike the first example (In this case, a developing solution L is caused to enter the through hole 2 from one side), and the outer masking layer 10 is separated and eliminated.

Next, copper-plating 5 is provided. This copper-plating 5 is provided only on the inner wall surface of the through hole 2 and the opening periphery 3 thereof on both sides (one side and the other side) unlike as in FIG. 2C described in the first example. The copper-plating 5 on the inner wall surface of the through hole 2 and the copper-plating 5 on the opening periphery 3 on both sides, in other words, the formed button section 4 is coated with a metal protective film 9 (refer to FIG. 2D and FIG. 3A for comparison. The masking layer 11 is not used here).

After the photosensitive dry film 8 is separated and eliminated in the same manner as the first example, the substrate 6 is given patterning to manufacture the printed wiring board E as shown in FIG. 3C. The overlaying treatment is carried out after the printed wiring board E is manufactured.

In the manufacturing method of the second example, the photosensitive dry film 8 is coated on both sides of the outer surface of the substrate 6, and is developed and hardened as the plating resist. The inside of each through hole 2 which was opened by causing the photosensitive dry film 8 to be dissolved and eliminated and the opening periphery 3 of the through hole 2 on both sides are copper-plated 5 as the button section 4. The copper-plating 5 of the button section 4 is then coated with a metal protective film 9 with etching resistance.

Since other construction, function and the like of the second example are as described in the first example, further explanation is omitted.

The example of application of the present invention to the new button plating method (both sides) is as described above.

<<Example of Application to the Old Button Plating Method (Both Sides)>>

The third example of the present invention, that is, an example of application to the old button plating method (both sides) is described hereunder with reference to FIGS. 4 and 5.

Figure 5A:
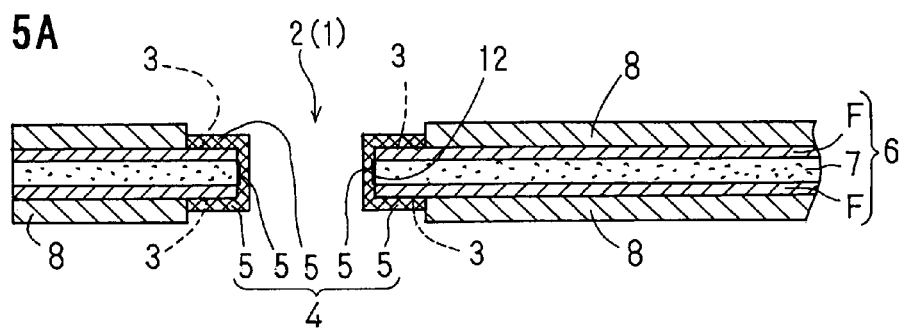
FIG. 5A shows a copper-plating step.
Figure 5B:
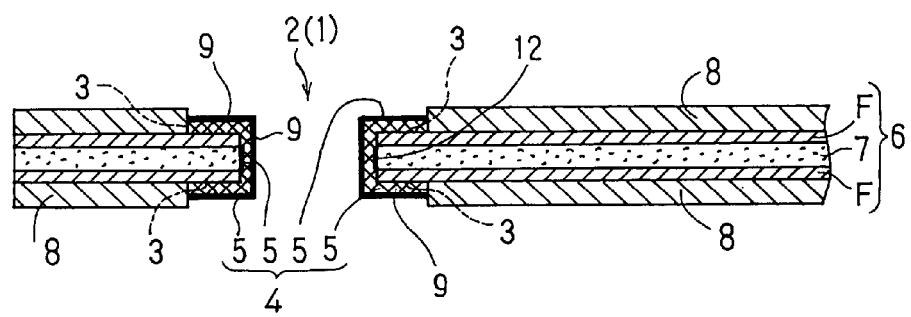
FIG. 5B shows a metal protective film forming step.
Figure 5C:
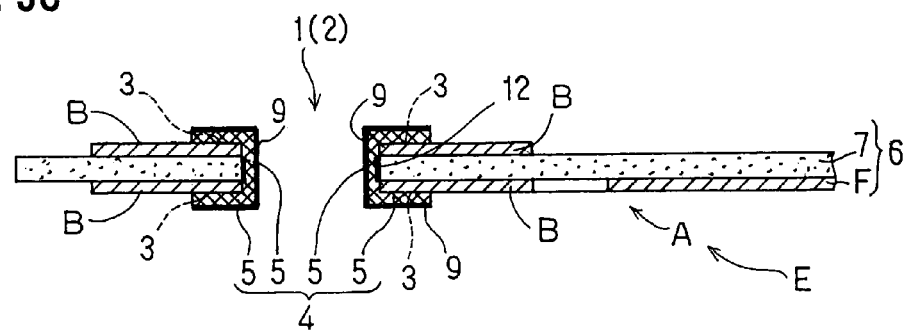
FIG. 5C shows a printed wiring board.

In the manufacturing method of the third example, the photosensitive dry film 8 is coated, exposed and developed on both sides of the substrate 6 as a negative mask, and as shown in FIG. 5C, the inner wall surface of each through hole 2 of the substrate 6 and the opening periphery 3 of the through hole 2 on both sides (one side and the other side) are provided with the copper-electroplating 5 as the button section 4.

The copper-plating 5 of the button section 4 is then coated with a metal protective film 9 with etching resistance.

Figure 4A:
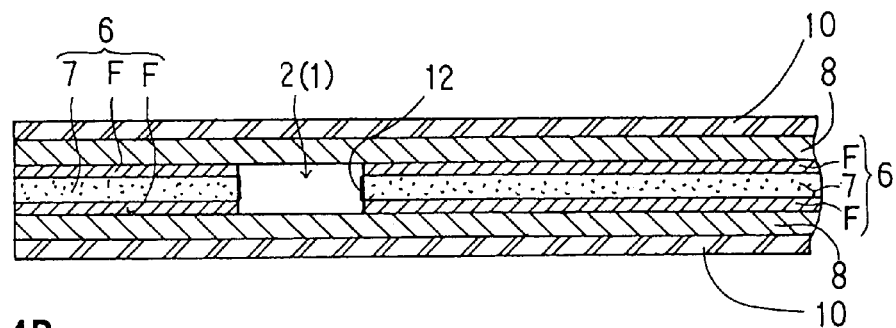
FIG. 4A shows a coating step.

This manufacturing method of the third example will be described further. In this manufacturing method, by following the steps as shown in FIGS. 1A through 2B in the same manner as the first example described above, the photosensitive dry film 8 is laminate-coated as shown in FIG. 4A on both sides of the substrate 6 provided with through hole 2 with a conductive film 12 attached together with an outer masking layer 10 consisting, for example, of a separator.

Figure 4B:
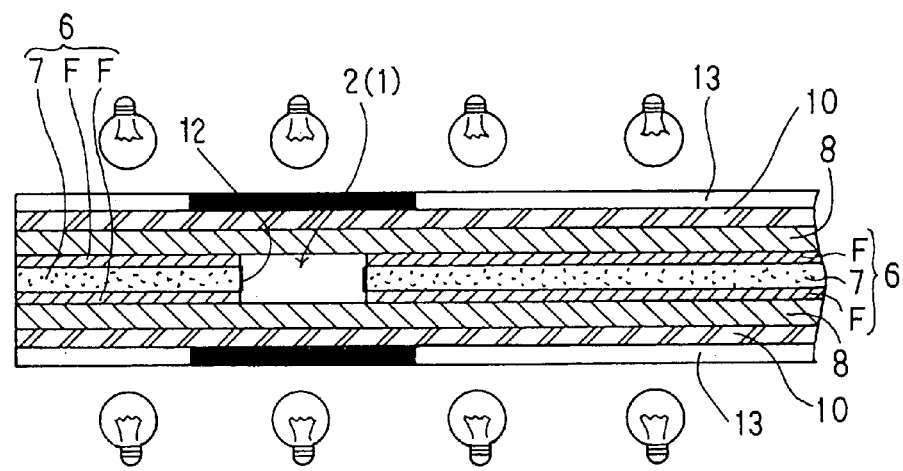
FIG. 4B shows an exposing step.
Figure 4C:
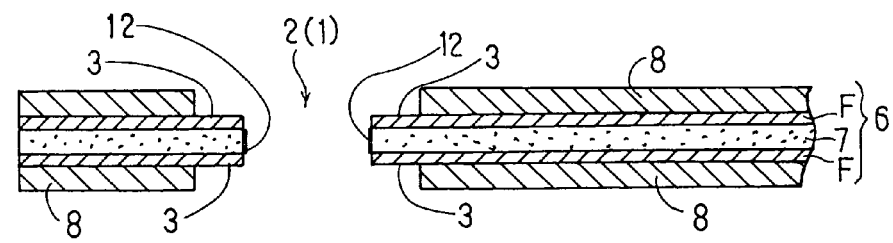
FIG. 4C shows a separating step.

As shown in FIG. 4B, after a photomask 13 which is a negative mask is applied on the outside of the photosensitive dry film 8 and the outer masking layer 10 on both sides, the photosensitive dry film 8 is exposed and hardened as a plating resist. As shown in FIG. 4C, the photomask 13 and the outer masking layer 10 are separated and eliminated to dissolve and eliminate part of the photosensitive dry film 8, which is unnecessary, except for the hardened section by a developing solution. There are a film type and a glass type in the photomask 13.

As shown in FIG. 5A, copper-plating 5 is conducted. The inner wall surface of the through hole 2 and the opening periphery 3 on both sides which were opened by causing the unnecessary part of the photosensitive dry film 8 to be dissolved and eliminated are copper-plated as the button section 4. As shown in FIG. 5B, the copper-plating 5 of the button section 4 is coated with a metal protective film 9. After separating and eliminating the photosensitive dry film 8, a printed wiring board E is manufactured by patterning as shown in FIG. 5C. The overlaying treatment is then conducted.

In the manufacturing method of the third example, the photosensitive dry film 8 is coated on both sides of the outer surface of the substrate 6 and developed and hardened as a plating resist. The inside of the through hole 2 which was opened by causing the photosensitive dry film 8 to be dissolved and eliminated and the opening periphery 3 of the through hole 2 on both sides are copper-plated as the button section 4. The copper-plating 5 of the button section 4 is coated with a metal protective film 9 with etching resistance.

Since other construction, function and the like of the third example are as described in the first example, further explanation is omitted.

The example of the application of the present invention to the old button plating method (both sides) is as described above.

<<Example of Application to the Old Button Plating Method (One Side)>>

A fourth example of the present invention, that is, an example of the application to the old button plating method (one side) will be described with reference to FIG. 6.

Figure 6A:
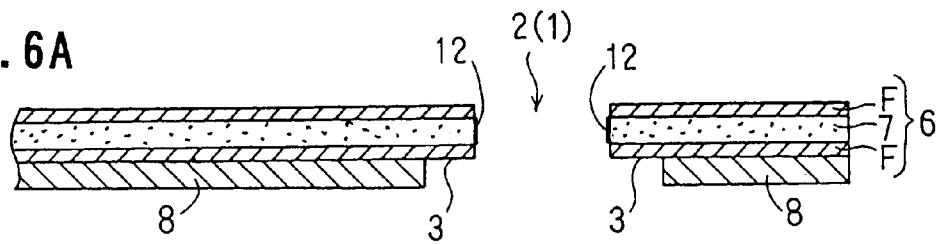
FIG. 6A shows a separating step.
Figure 6B:
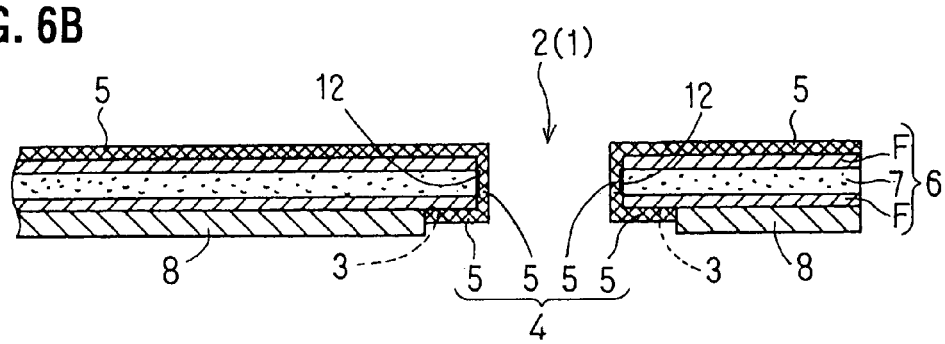
FIG. 6B shows a copper-plating step.
Figure 6C:
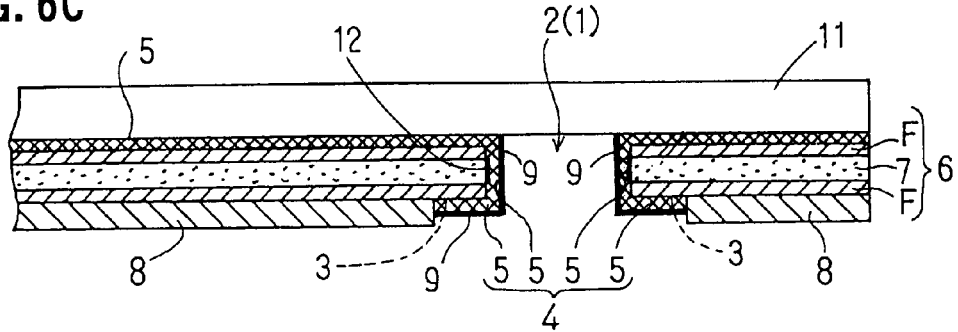
FIG. 6C shows a metal protective film forming step.
Figure 6D:
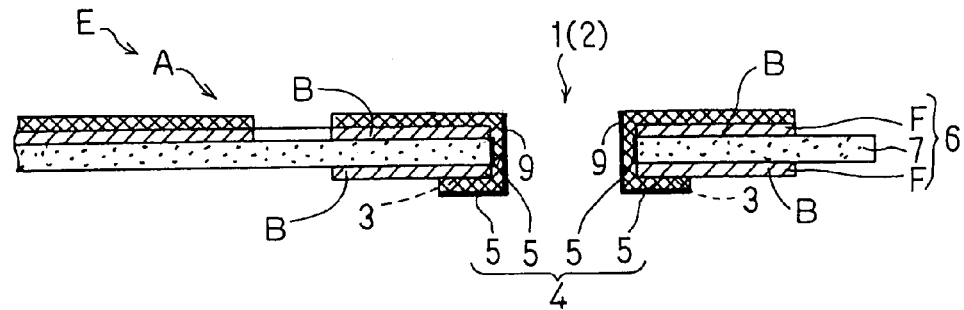
FIG. 6D shows a printed wiring board.

In the manufacturing method of the fourth example, the photosensitive dry film 8 is coated only on one side and exposed and hardened, wherein as shown in FIG. 6D, the inner wall surface of each through hole 2 of the substrate 6 and the opening periphery 3 on one side are copper-electroplated 5 as the button section 4. The copper-plating 5 of the button section 4 is coated with a metal protective film 9 with etching resistance.

The manufacturing method of the fourth example will be described in detail. In this manufacturing method, after the photosensitive dry film 8 is coated on only one side of the substrate 6 which is provided with a through hole 2 with the conductive film 12 attached in the same manner as each example described above, the photosensitive dry film 8 is exposed using a negative mask.

As shown in FIG. 6A, after the photosensitive dry film 8 on one side is developed, copper-plating 5 is performed as shown in FIG. 6B (This corresponds to FIG. 2C of the first example described above). As shown in FIG. 6C, the other side (of the substrate 6) is coated with a masking layer 11 to be coated with a metal protective film 9 (This corresponds to FIGS. 2D and FIG. 3A of the first example described above). Namely, the inner wall surface of each through hole 2 of the substrate 6 and the opening periphery 3 on one side are provided with the copper-plating 5 as the button section 4 and are coated with a metal protective film 9.

After the masking layer 11 and the photosensitive dry film 8 are separated and eliminated, the circuit pattern A is formed as shown in FIG. 6D by following the patterning steps and thus, a printed wiring board E is manufactured. The overlaying treatment is then performed.

Since construction, function and the like of the fourth example are as described in the first and third examples, further explanation is omitted.

The example of the application of the present invention to the old button plating method (one side) is as described above.

<<Operation and the Like>>

The method for manufacturing the printed wiring board E of the present invention is constructed as above. The operation and the like of the present invention are described hereunder.

(1) In this manufacturing method, after a number of through holes 2 (for through-holes 1) is provided in a substrate 6 made of an insulating material 7 of which both sides are coated with a copper foil F, the inner wall surface of the through holes 2 are made electrically conducting.

(2) The outer surface of the substrate 6 is then coated with a photosensitive dry film 8. The photosensitive dry film 8 is developed and hardened as a plating resist. In this manner, the inner wall surface of each through hole 2 which was opened by causing the photosensitive dry film 8 to be dissolved and eliminated, and the opening periphery 3 of the through hole 2 are provided with the copper-plating 5 as a button section 4.

For example, the photosensitive dry film 8 is coated on one side of the substrate 6, and developed and hardened, wherein the inner wall surface of the opened through hole 2, the opening periphery 3 of the through hole 2 on one side and the entire copper foil F on the other side are provided with the copper-plating 5 as the button section 4 (refer to the first example of FIGS. 1, 2, 3A through 3C and the fourth example of FIG. 6). In other words, the photosensitive dry film 8 is coated on both sides of the substrate 6, and developed and hardened, wherein the inner wall surface of the opened through hole 2 and the opening periphery 3 of the through hole 2 on both sides are provided with the copper-plating 5 as the button section (refer to the second example of FIG. 3D and the third example of FIGS. 4 and 5).

Provision of the plating resist of the photosensitive dry film 8 can be provided by a method using the photomask 13 (the old button plating method by the third and fourth examples) or by a method whereby the developing solution L is poured into the through hole 2 (the new button plating method by the first and second examples).

(3) The substrate 6 is provided so that, after the copper-plating 5 of the button section 4 is coated with a metal protective film 9 with etching resistance, the photosensitive dry film 8 is eliminated.

(4) The substrate 6 is provided so that the circuit pattern A is formed by the copper foil on both sides by following the known patterning steps of exposure, development, etching and separation.

(5) The overlaying treatment is conducted as a post-processing step on the substrate 6 on which the circuit pattern A has been formed, that is, on the manufactured printed wiring board E.

(6) The manufacturing method of the printed wiring board E of the present invention has the following first and second operations.

First, in the manufacturing method of the present invention, the substrate 6 of the item (1) above is provided so that each button section 4 of the item (2) is coated with a metal protective film 9 with etching resistance as described in the item (3). In other words, the metal protective film 9 becomes a local etching resist for protecting the button section 4.

In the step of forming the circuit pattern A of the item (4), when a location (diameter) of each button section 4 and a location (diameter) of each land on the circuit pattern A side are out of position due to expansion and contraction of the substrate 6, expansion and extraction of the photosensitive resist film for patterning, incorrect positioning and the like (it is of course ideal that there is no displacement as shown in FIG. 7A, but the incorrect position or displacement often occurs as shown in FIG. 7B), the following operation is considered.

Since each button section 4 on which the copper-plating 5 has been applied is coated in advance with a metal protective film 9 with etching resistance, the button section 4 is not dissolved and eliminated by the etching solution, and occurrence of its loss or dropping out can be avoided. A number of button sections 4 is formed in advance before patterning and there is a possibility that any unprotected protruding area covered by the photosensitive resist film hardened for forming each land B corresponding to each button section 4 in the subsequent patterning is caused. However, such a protruding area is not partially lost by etching.

As described above, each button section 4 can be maintained (refer to FIG. 7B of the present invention and FIG. 7F of the conventional example for comparison). Even though there is slight displacement (incorrect position), conductance between the button section 4 and the land B can be secured providing they overlap even a little.

Second, in the manufacturing method of the present invention, the substrate 6 is provided so that each button section 4 is coated with a metal protective film 9 with etching resistance. This means that the metal protective film 9 becomes a local etching resist for protecting the button section 4.

The overlaying treatment of the item (5) above is conducted as a post-processing step after the circuit pattern A is formed. In this case, a soft etching treatment is applied on the surface of the copper foil F of the circuit pattern A as a pre-processing step for the overlaying treatment, but there is a possibility that the soft etching solution D remains as puddles within each through hole 2 due to insufficient cleaning, insufficient drying and the like (refer to FIG. 7C). However, this can be solved even though time goes by.

Namely, Since the copper-plating 5 within the inner wall surface of the through hole 2 of each button section 4 is coated and protected by the metal protective film 9 with etching resistance, the copper-plating 5 is not dissolved and eliminated by the soft etching solution D remaining in the puddled condition (refer to FIG. 7D of the present invention and FIG. 7H of the conventional example for comparison). Even in the case where the soft etching solution D remains as puddles in the subsequent overlaying treatment, the copper-plating 5 within the inner wall surface of the through-hole 1 of each button section 4 is not affected by etching, but maintained as is.

<<Others>>

First, remnants of the metal protective film 9 will now be described. In the case where nickel gold plating or nickel plating is used as the metal protective film 9, there is no worry that the problems resulting from fusion (melting) occur because this metal protective film 9 has a high fusing (melting) point. There is also no problem even though the metal protective film 9 is caused to remain on the printed wiring board E as a final product.

On the contrary, if solder plating or tin plating is used as the metal protective film 9 and the film 9 is caused to remain on the printed wiring board E as a final product as is, there is a possibility that the metal protective film 9 will dissolve in the high-temperature reflow (i.e., soldering for setting the semiconductor parts). In such a case, it is desirable that the metal protective film 9 be separated and eliminated in advance after the patterning step and the like.

Second, in the examples as described above, the printed wiring board E is described taking the flexible printed wiring board as an example, but the manufacturing method of the printed wiring board E of the present invention is not limited to this, but is of course applicable to a rigid printed wiring board as well.

What is claimed is:

1. A printed wiring board manufacturing method comprising the steps of:
   (a) providing a number of through holes in a substrate made of an insulating material coated with a copper foil;
   (b) forming a conductive film for making the inside of the through holes electrically conductive;
   (c) coating an outer surface of the substrate with a photosensitive dry film, and developing and hardening the photosensitive dry film as a plating resist;
   (d) copper-plating the inside of the through holes, opened by causing the photosensitive dry film to be dissolved and eliminated, and copper-plating the opening periphery of the through holes;
   (e) forming a metal protective film for coating the copper-plated area with the metal protective film;
   (f) separating and eliminating photosensitive dry film;
   (g) forming a circuit pattern with the copper foil; and
   (h) performing an overlaying treatment as a post-process to protect the circuit pattern, wherein in the coating, developing and hardening steps, the photosensitive dry film is coated on one side of the outer surface of the substrate made of a laminated sheet of which both sides are coated with copper, and in the copper-plating step, at least the inside of the through holes and the opening periphery of the through holes on one side are copper-electroplated, and in a masking step for coating the other side of the outer surfaces of the substrate with a masking layer is conducted between the copper-plating step and the metal protective film forming step, and a step for eliminating the masking layer is conducted together with the separating step after the metal protective film forming step.

2. The printed wiring board manufacturing method according to claim 1, wherein the insulating material of the substrate is formed in a film shape with flexibility and the printed wiring board is a flexible printed wiring board.

3. The printed wiring board manufacturing method according to claim 1, wherein the insulating material of the substrate is made of a hard material and the printed wiring board is a rigid printed wiring board.

4. The printed wiring board manufacturing method according to claim 1, wherein the metal protective film in the metal protective film forming step is formed with nickel gold plating, solder plating, tin plating, silver plating or nickel plating to protect the copper-plating against etching in the circuit forming step and against soft etching which is pre-processing for the overlaying treatment as the post-processing.

5. The printed wiring board manufacturing method according to claim 1, wherein in the circuit forming step, the substrate is coated with a photosensitive resist film, the photosensitive resist film is exposed, hardened and developed using a circuit mask, the copper foil of the substrate is etched, and the remaining photosensitive resist film is separated, thereby forming the circuit pattern.

\* \* \* \* \*